United States Patent
Hill et al.

(10) Patent No.: US 8,879,269 B2
(45) Date of Patent: Nov. 4, 2014

(54) SYSTEMS AND METHOD FOR PROVIDING A GRAPHITE LAYER IN AN ELECTRONIC DEVICE

(75) Inventors: Matthew Hill, Mountain View, CA (US); Richard Hung Minh Dinh, San Jose, CA (US); Tang Tan, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 522 days.

(21) Appl. No.: 13/222,144

(22) Filed: Aug. 31, 2011

(65) Prior Publication Data

US 2013/0050950 A1   Feb. 28, 2013

(51) Int. Cl.
*H05K 7/20* (2006.01)
*H05K 9/00* (2006.01)

(52) U.S. Cl.
CPC .......... *H05K 9/0032* (2013.01); *H05K 7/20481* (2013.01)
USPC .......................................... 361/719; 361/818

(58) Field of Classification Search
None
See application file for complete search history.

(56) References Cited

U.S. PATENT DOCUMENTS

| | | | |
|---|---|---|---|
| 5,285,350 A * | 2/1994 | Villaume | 361/690 |
| 6,025,991 A * | 2/2000 | Saito | 361/704 |
| 6,084,178 A * | 7/2000 | Cromwell | 174/383 |
| 6,195,267 B1 * | 2/2001 | MacDonald et al. | 361/800 |
| 6,673,998 B1 * | 1/2004 | Wu | 174/383 |
| 6,809,932 B2 | 10/2004 | Wu | |
| 7,254,034 B2 | 8/2007 | Bolle et al. | |
| 7,965,514 B2 * | 6/2011 | Hill et al. | 361/707 |
| 8,077,479 B2 | 12/2011 | Ligtenberg | |
| 8,488,334 B2 * | 7/2013 | McColloch | 361/818 |
| 2003/0117787 A1 | 6/2003 | Nakauchi | |
| 2007/0139904 A1 * | 6/2007 | English et al. | 361/818 |
| 2007/0210082 A1 * | 9/2007 | English et al. | 220/4.21 |
| 2011/0242764 A1 | 10/2011 | Hill et al. | |

* cited by examiner

*Primary Examiner* — Gregory Thompson

(57) ABSTRACT

Systems and methods are provided for a sheet of graphite material on an electromagnetic interference shield for enhanced heat transfer. An electronic device component may be enclosed by an EMI shield, which may retain heat generated by the component. To help dissipate heat, a sheet of material selected for its heat transfer properties may be disposed over the EMI shield. A portion of the sheet may be folded over an edge of the EMI shield such that the sheet may cover a top surface of the sheet as well as tabs extending perpendicular to the top surface of the EMI shield. To facilitate the adhesion of the sheet to a smaller surface area of tabs, the sheet may include features forming a discontinuity in regions of the sheet aligned with the edge of the shield to facilitate folding the sheet. The discontinuity can include, for example, one or more holes or windows.

20 Claims, 9 Drawing Sheets

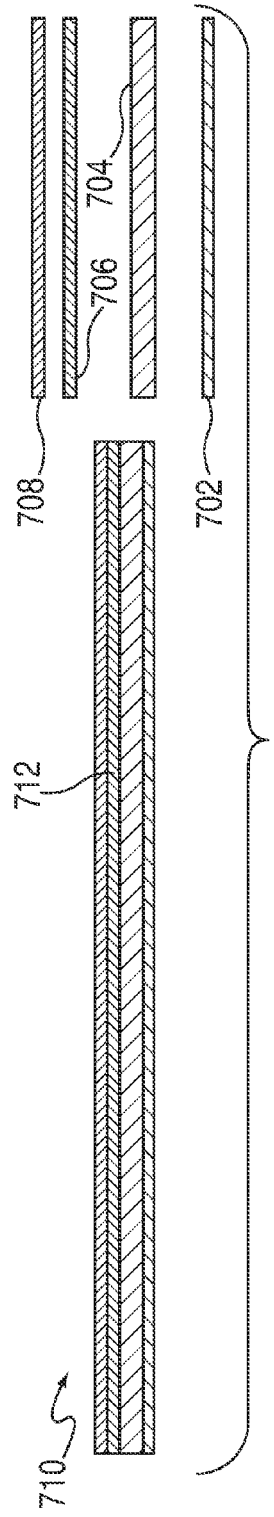
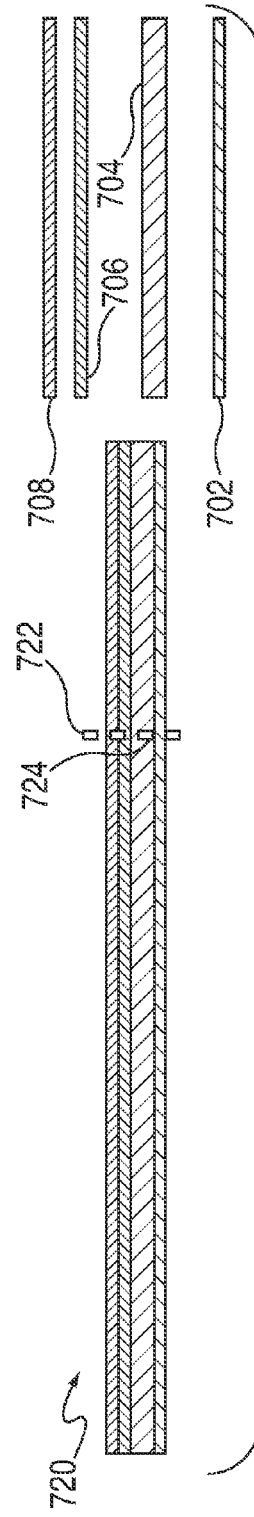
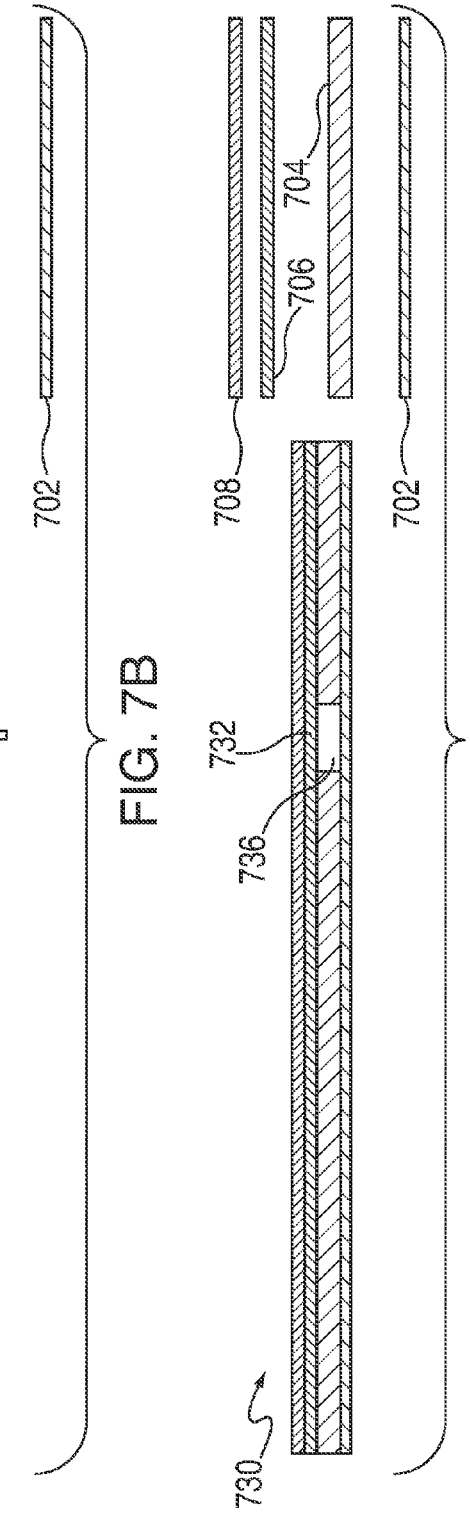
FIG. 7A
FIG. 7B
FIG. 7C

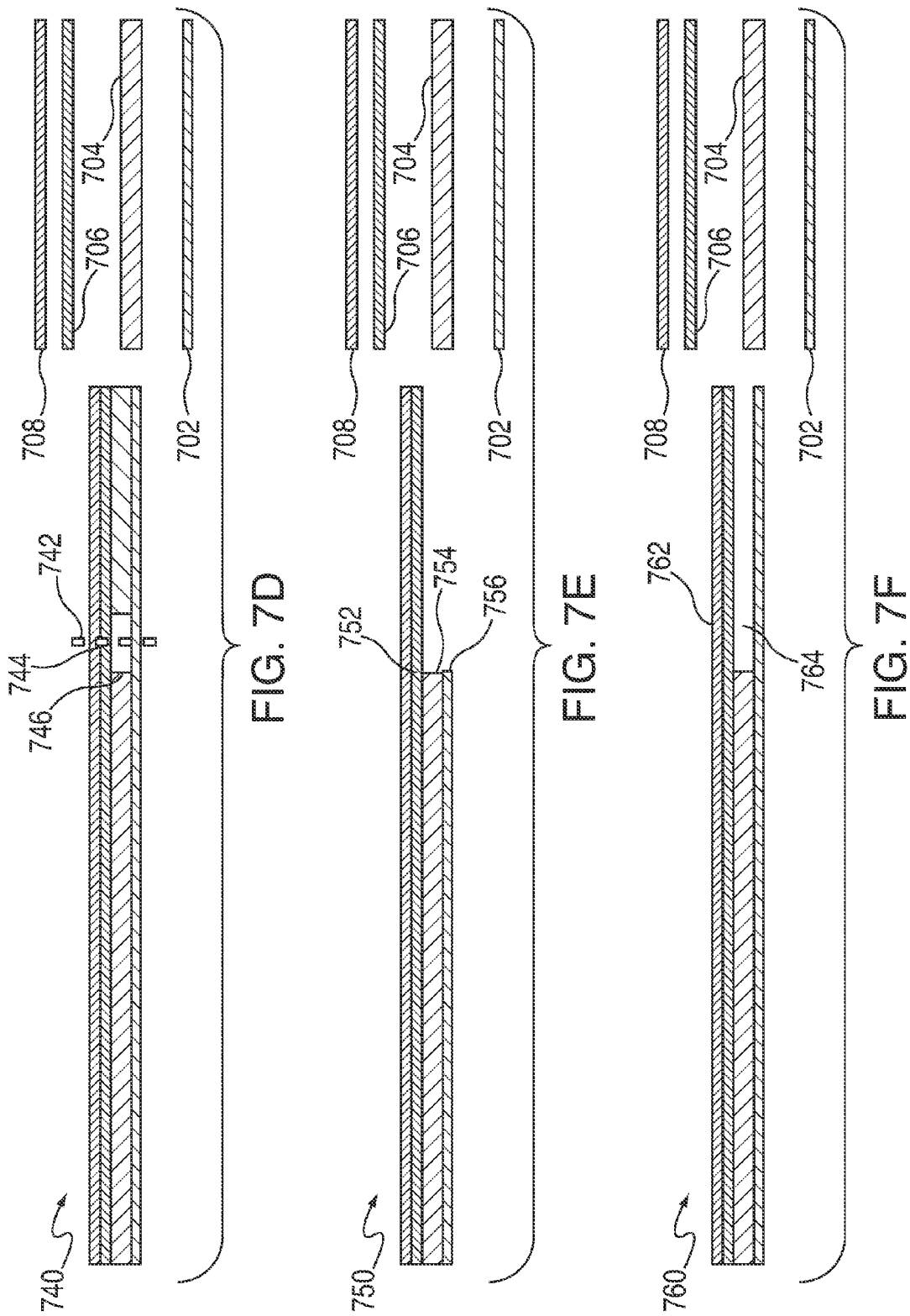

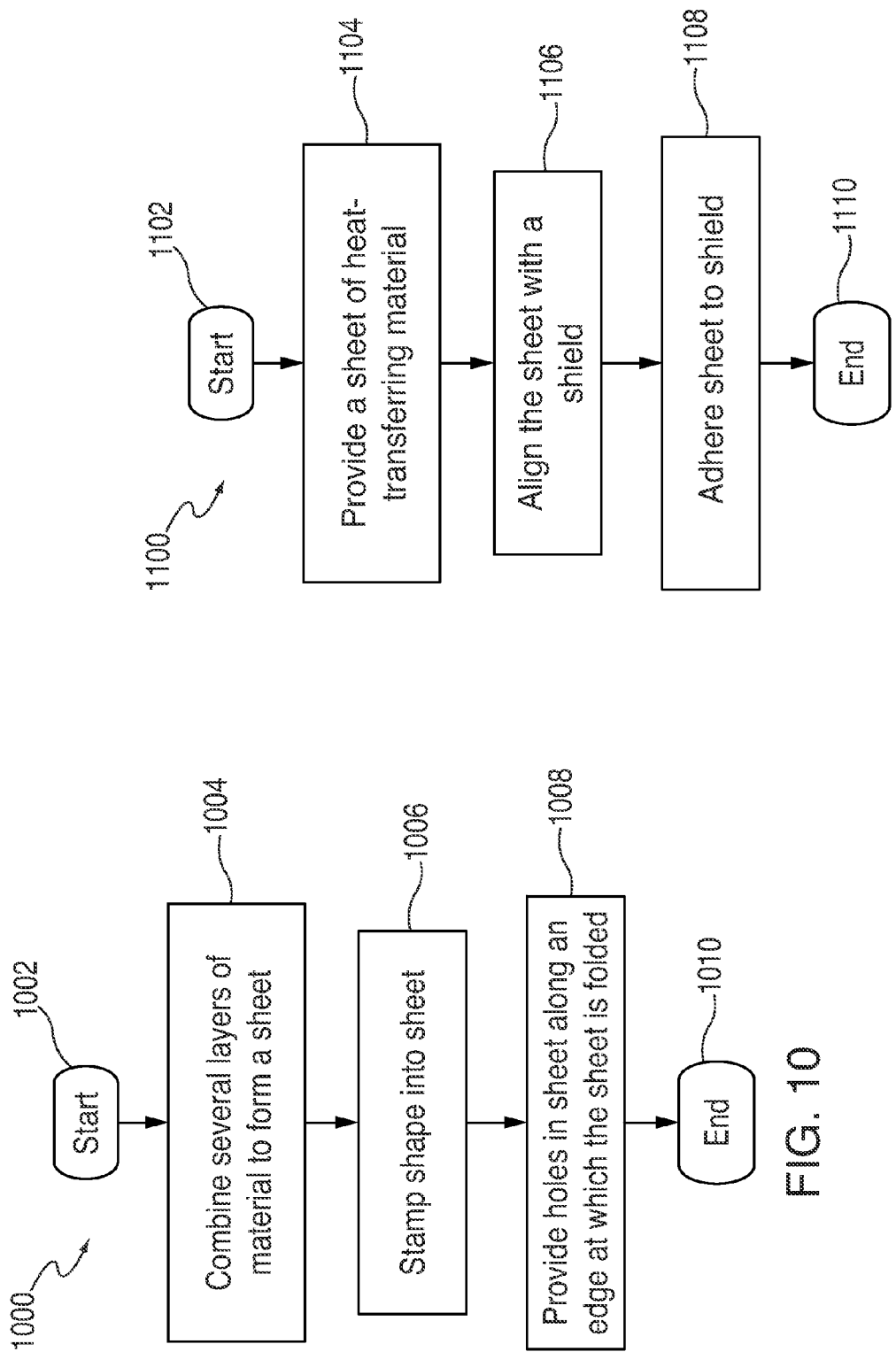

SYSTEMS AND METHOD FOR PROVIDING A GRAPHITE LAYER IN AN ELECTRONIC DEVICE

BACKGROUND OF THE INVENTION

Electronic devices include several electronic components used to process and transmit electrical signals. During use, some components may generate electromagnetic waves that may interfere with the proper operation of other components. To prevent electromagnetic interference (EMI), the electronic device can include one or more EMI shields placed over the components. The shields can be constructed, for example, from stamped sheet metal forming a box that is clipped over the components.

During use, electronic device components may also generate heat that must be dissipated to ensure proper operation of the components. Placing an EMI shield over a component, however, may reduce the ability of the components to dissipate heat. To improve the heat dissipation of a shielded component, a sheet of heat conducting material can be placed on a top surface of the EMI shield.

SUMMARY OF THE INVENTION

This is directed to systems and methods for providing a graphite layer in an electronic device for enhancing heat transfer.

An electronic device component may be shielded from EMI using a shield placed over the component. The shield can be constructed, for example, from a piece of sheet metal having a planar or top surface from which side walls or tabs extend. Heat generated by the component may be in part trapped by the shield. To help dissipate the generated heat, a sheet of graphite material may be coupled to the shield. In some cases, the sheet can include several layers of different material that are coupled to each other.

The sheet may be disposed such that a portion of the sheet is coupled to the top surface and another portion of the sheet is coupled to the tabs. Because the sheet may include a fold over the edge of the shield, the sheet may include a discontinuity that facilitates the fold and enhances adhesion to the smaller surface area of the tabs. The discontinuity may include, for example, one or more holes, windows, openings, or entirely or partially empty or unfilled layer of material within the sheet.

BRIEF DESCRIPTION OF THE FIGURES

The above and other objects and advantages of the invention will be apparent upon consideration of the following detailed description, taken in conjunction with the accompanying drawings, in which like reference characters refer to like parts throughout, and in which:

FIGS. 7A-7F are sectional views of illustrative sheets of material for use in accordance with some embodiments of the invention;

FIG. 10 is a flowchart of an illustrative process for constructing a sheet of material for transferring heat from a shield of a component in accordance with some embodiments of the invention; and FIG. 11 is a flowchart of an illustrative process for adhering a sheet to a shield in accordance with some embodiments of the invention.

DETAILED DESCRIPTION OF THE INVENTION

Figure 1:
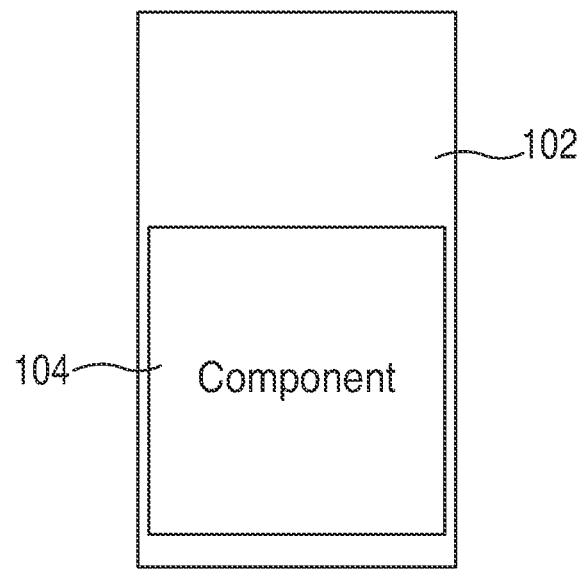
FIG. 1 is a schematic view of an illustrative circuit board and component in accordance with some embodiments of the invention.

An electronic device can include a circuit board on which one or more electronic device components are placed. FIG. 1 is a schematic view of an illustrative circuit board and component in accordance with some embodiments of the invention. As shown, component 104 is mounted to circuit board 102. For example, component 104 can be mounted by soldering, surface mount technology (SMT), a conductive adhesive, or using any other suitable approach. Circuit board 102 can include any suitable type of board or circuit on which components can be mounted. For example, circuit board 102 can include a printed circuit board, flex circuit, or any other type of circuit. Component 104 can include any suitable type of electrical component such as, for example, a processor, controller, signal processor, communications module, or any other component coupled to a circuit board.

Some components may generate electromagnetic waves during use. These waves may propagate within the device and interfere with the proper functioning of other components. To prevent this, individual components can be shielded using an EMI shield. The EMI shield can be constructed from a conductive element such as a metal lid placed over the component. The lid can be secured within the electronic device using any suitable approach. In some cases, the lid can engage a fence that is secured to the circuit board around the component. Alternatively, the lid can be secured directly to the circuit board.

Figure 2:
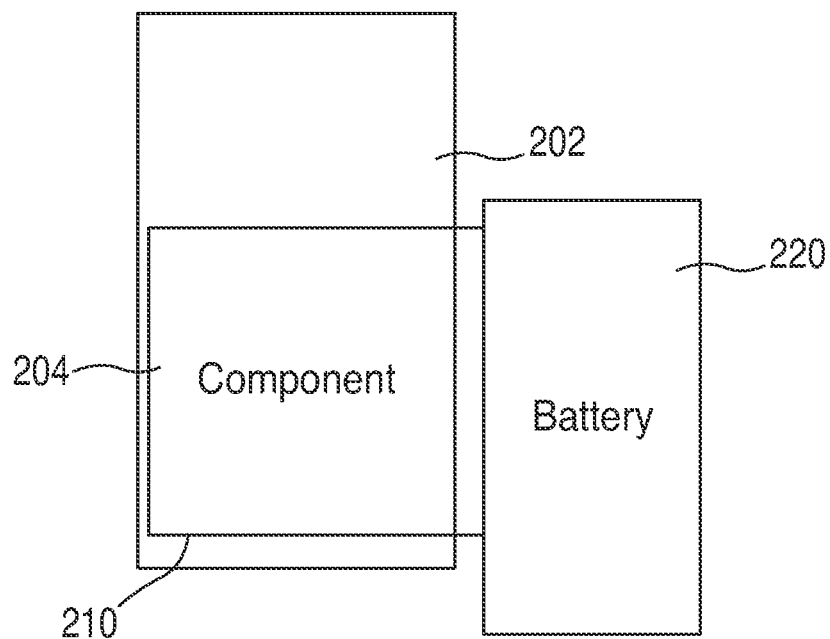
FIG. 2 is a schematic view of an illustrative circuit board and component over which a shield is placed in accordance with some embodiments of the invention.

FIG. 2 is a schematic view of an illustrative circuit board and component over which a shield is placed in accordance with some embodiments of the invention. Circuit board 202 and component 204 can have some or all of the features of the circuit board 102 and component 104 (FIG. 1), respectively. To shield component 204 from EMI, shield 210 can be placed over component 204. Shield 210 can include a lid portion having a planar top surface that is placed adjacent to a surface of component 204 that is co-planar with a surface of circuit board 202. To secure shield 210 over component 204, shield 210 can include side walls (not shown) extending substantially perpendicular from the top surface. The side walls may engage a frame extending from circuit board 202, for example using an interference fit, or via dimples or other features.

Different components can be provided near component 204 and shield 210. For example, another circuit board and component(s) can be placed adjacent to circuit board 202. As another example, a stand alone component such as a battery can be placed near component 204 and shield 210. In the particular example of FIG. 2, battery 220 can be placed adjacent to circuit board 202 such that battery 220 is near shield 210.

Figure 3:
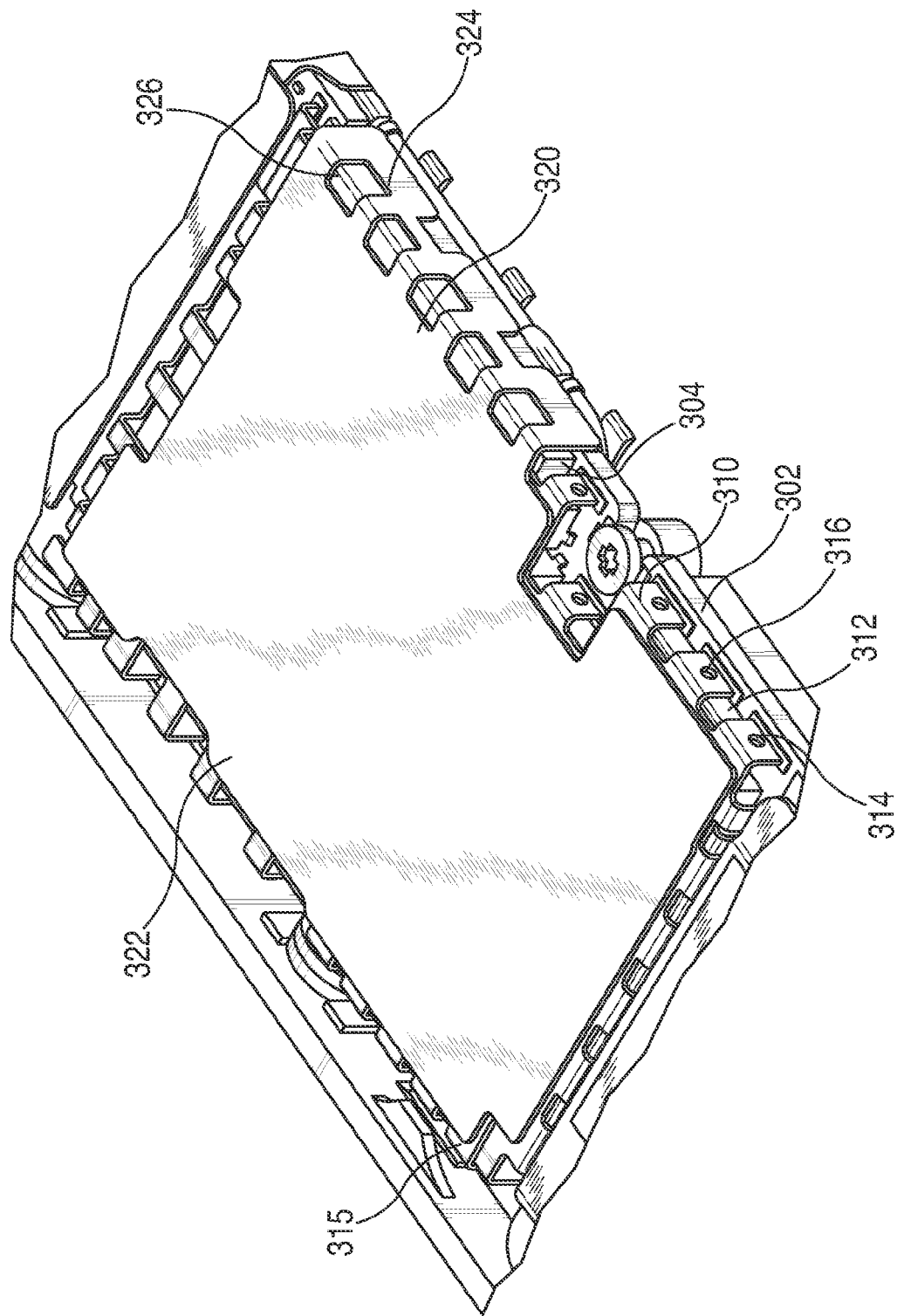
FIG. 3 is a perspective view of an illustrative circuit board and component over which a shield is placed in accordance with some embodiments of the invention.
Figure 4:
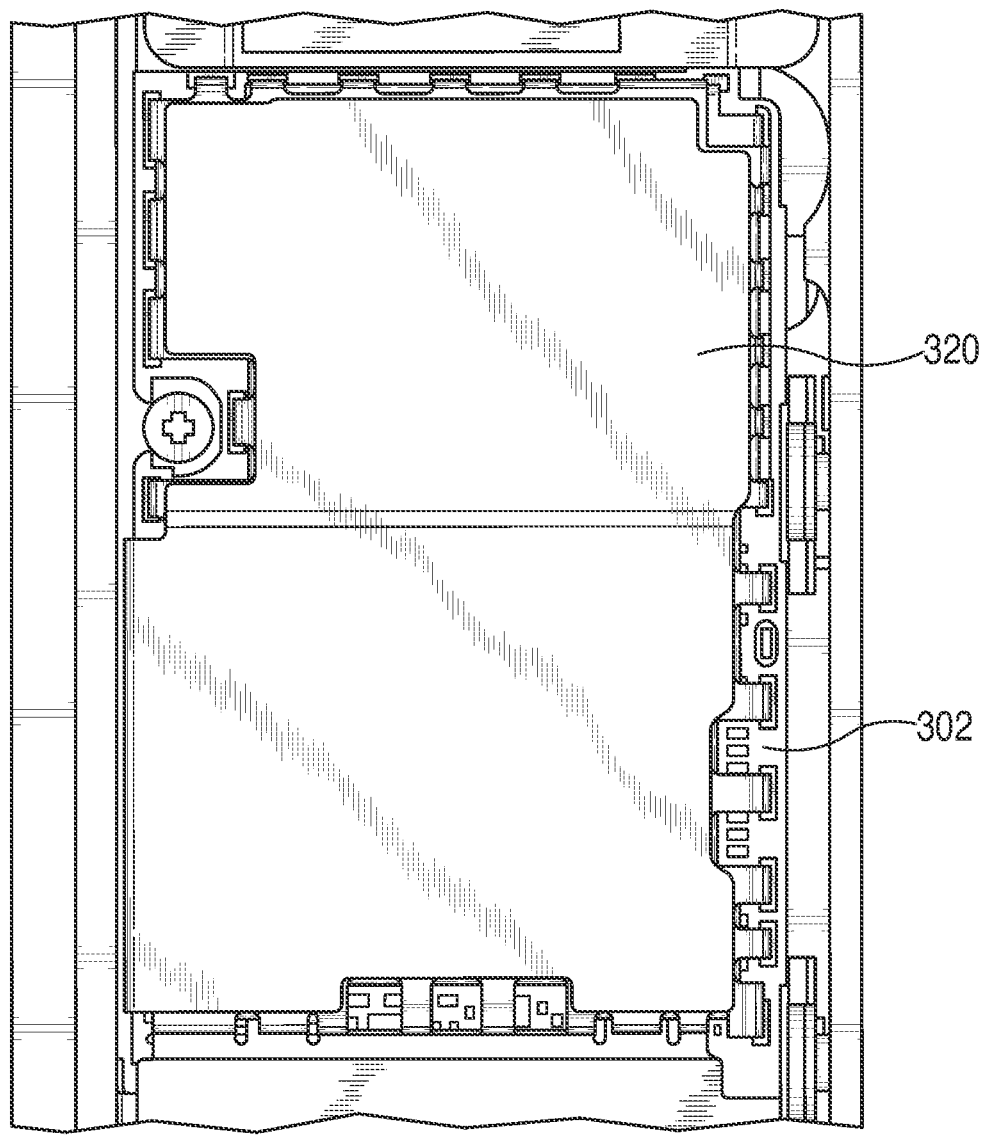
FIG. 4 is a top view of the illustrative circuit board and component over which a shield is placed of FIG. 3 in accordance with some embodiments of the invention.

More detailed views of a board assembly having an EMI shield covered by a heat transfer material in accordance with embodiments of the invention are provided in FIGS. 3 and 4. In particular, FIG. 3 is a perspective view of an illustrative board assembly and FIG. 4 is a top view of the same board assembly. As shown, component 304 is mounted to circuit board 302, and EMI shield 310 is mounted over component 304. Also shown, is heat transfer material 320 disposed on EMI shield 310

EMI shield 310 can be constructed from one or more distinct elements. For example, EMI shield 310 can include fence 312 forming a wall extending perpendicular to a surface of circuit board 302. Fence 312 can be secured to circuit board 302 using any suitable approach including, for example, using soldering. Fence 312 can include one or more segments disposed around the periphery of component 304. The segments may be substantially continuous, and include a height that is similar to the height of component 304. For example, fence 312 may have a height that is the same height as or marginally higher than the height of component 304. In some cases, fence 312 may surround several components mounted to circuit board 302.

To complete EMI shield 310, lid 314 can be placed over fence 312 such that lid 314 engages fence 312. Lid 314 can include planar surface 315 sized to correspond to the area enclosed by fence 312. Lid 314 can also include tabs 316 extending substantially perpendicular from planar surface 315 such that tabs 316 may engage fence 312 to secure lid 314 to fence 312. Lid 314 can include any suitable number of tabs extending from surface 315. For example, lid 314 can include tabs placed apart by less than a maximum amount (e.g., no more than 3 mm separate tabs). In some cases, one or both of tabs 316 and fence 312 can include features for securing lid 314 to fence 312. For example, each tab 316 can include a dimple that extends into a hole or opening of fence 312.

Lid 314 can be constructed using any suitable approach. In some cases, lid 314 can be constructed from a piece of sheet metal that is stamped. As a result of the stamping process, tabs 316 can have sharp edges. When other components placed adjacent to lid 314 move or are jostled, for example, during a drop event, the other components may come into contact with tabs 316 and be damaged. If the other components include a battery module that has a relatively small outer shell (e.g., only a Mylar sheet) due to space constraints, the tabs may damage the battery should the battery come into contact with the tabs during a drop event. Accordingly, it may be desirable to provide an additional barrier along the edges of tabs 316.

In addition, component 304 may generate heat during use. Because component 304 is enclosed by EMI shield 310, and lid 314 is constructed from a metal, the heat generated by component 304 may be retained adjacent to component 304 and adversely affect the performance of component 304. Different approaches can be used to enhance the heat transfer capabilities of the shield. In some cases, a layer of material selected for its heat transferring capabilities may be placed in contact with EMI shield 310 such that heat generated by component 304 may be transferred from EMI shield 310 and the layer of material away from component 304.

Any suitable type of material may be used to transfer heat away from component 304. For example, the material can include a carbon allotrope such as graphite, graphene, diamond, amorphous carbon, fullerenes, carbon nanotubes, carbon nanobuds, glassy carbon, carbon nanofoam, lonsdaleite, or other carbon allotrope. In some cases, other types of material can be used such as, for example, metals, composite materials, or other material that enables the transfer of heat.

Material may be disposed over any suitable portion of EMI shield 310 to form part of a board assembly. In some cases, some material may be provided on external portions of fence 312. Such an approach, however, may not be preferable as external portions of fence 312 may be placed in contact with tabs 316, which may adversely affect or even negate the heat transfer benefits of the material.

In some cases, the material may instead or in addition be provided on lid 314. For example, a sheet of material may be placed on planar surface 315. As another example, one or more sheets of material may be placed on tabs 316 disposed along each edge of planar surface 315. Each sheet of material may be secured to a portion of lid 314 using any suitable approach including, for example, an adhesive. Because the surface area of tabs 316 may be relatively small (e.g., due to the small height of component 304), it may be difficult to adhere material to the tabs. In such cases, it may be simpler to provide material only on planar surface 315.

In other cases, however, a same piece of material may be used to cover different regions of lid 314. For example, as shown in FIGS. 3 and 4, material 320 may be disposed over lid 314 such that portion 322 of material 320 is disposed over planar surface 315 and portion 324 of material 320 is disposed over tabs 316. The material may include a fold at an edge of planar surface 315 so that the same piece of material may extend over different planes of lid 314. In particular, material 320 may include a 90 degree fold 326.

Figure 5:
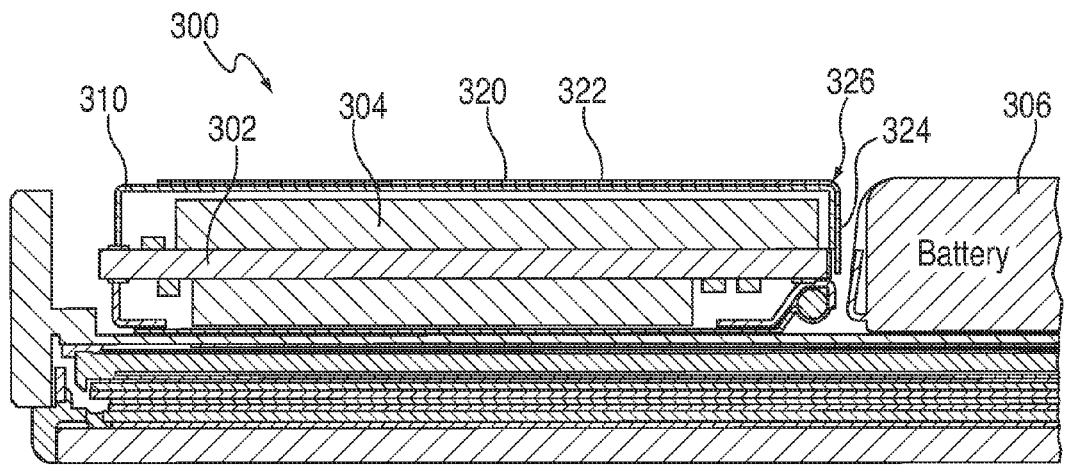
FIG. 5 is a sectional view of the component, shield, and material shown in FIGS. 3 and 4 in accordance with some embodiments of the invention.

FIG. 5 is an illustrative sectional view of the board assembly of FIGS. 3 and 4 in accordance with some embodiments of the invention. To enhance thermal conduction and heat dissipation, material 320 may be disposed over shield 310, such that portion 322 of the material is overlaid on a planar surface of shield 310 and portion 324 of the material is overlaid on a tab of shield 310. Material 320 may include fold 326 corresponding to a boundary between portions 322 and 324 of the material, and that is aligned with an edge of shield 310.

In addition, the disposition of material 320 may provide additional mechanical benefits within the assembly of electronic device 300. As discussed above, shield 310 may include a lid having stamped tabs. Due to the stamping process, the tabs may have sharp edges that could cut other components that potentially come into contact with the tabs. Should the tabs of shield 310 come into contact with other components of electronic device such as, for example, battery 306, an outer shell of battery 306 may be damaged, which may in turn could damage the internal components of battery 306. By placing material 320 over the tabs of shield 310, electronic device 300 may provide a barrier between shield 310 and other components of the device.

Figure 6A:
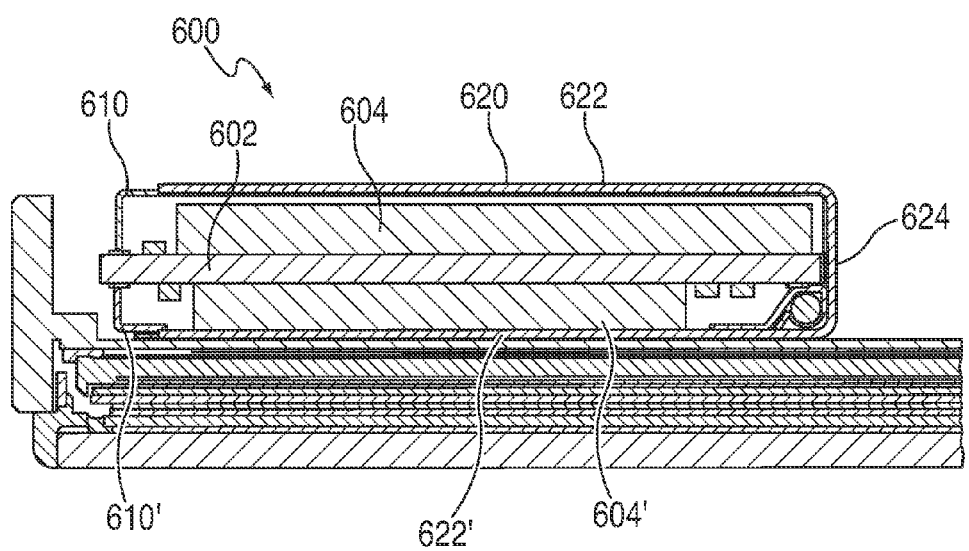
FIGS. 6A-6C are sectional views of an illustrative electronic device each having a component and a shield over which material is provided in accordance with some embodiments of the invention.
Figure 6B:
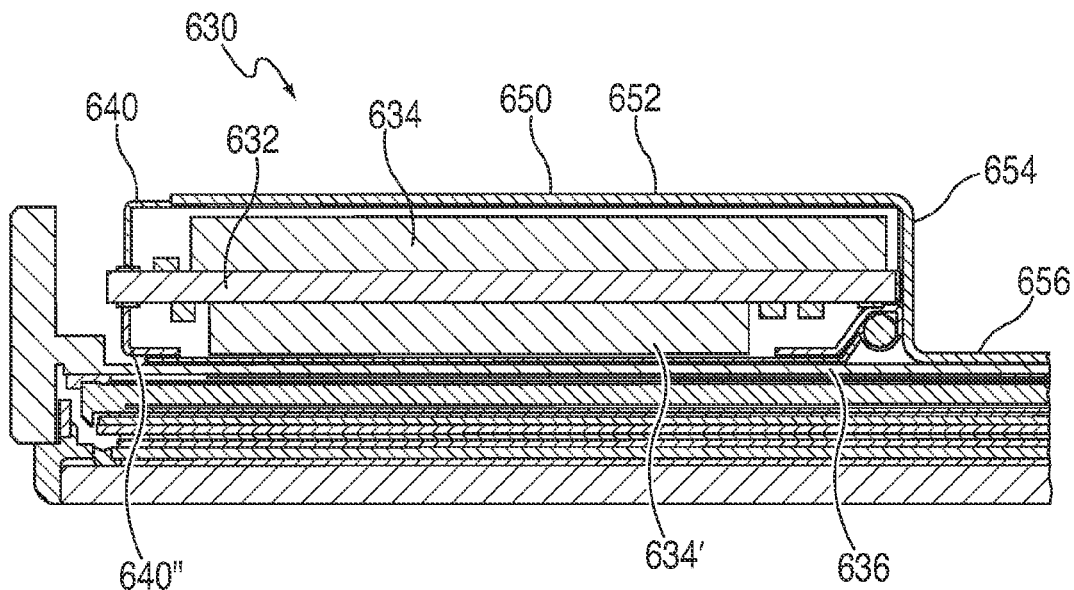
Figure 6C:
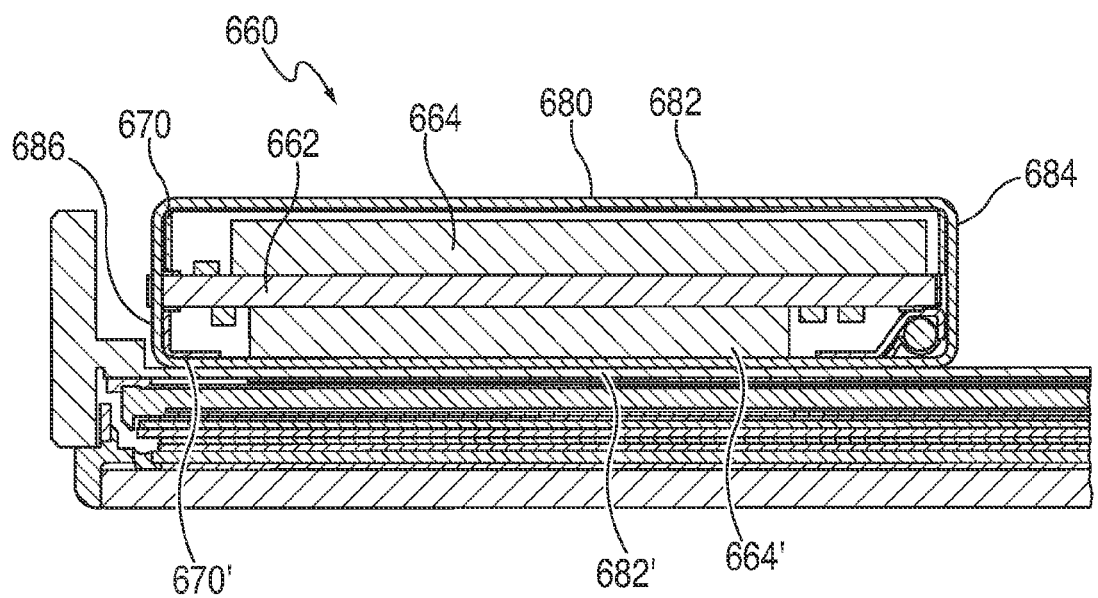

The material may be disposed over or around the shield using any suitable approach. FIGS. 6A-6C are sectional views of illustrative board assemblies each having a component and a shield over which material is provided in accordance with some embodiments of the invention. Board assembly 600, shown in FIG. 6A, can include component 604 mounted to circuit board 602. Shield 610 may be placed over component 604 such that the component is enclosed within a volume defined by circuit board 602 and shield 610. In some cases, circuit board 602 can include a second component 604' coupled to a surface of circuit board 602 opposite the surface to which component 604 is coupled. Board assembly 600 can include a second shield 610' coupled to circuit board 602 such that component 604' is enclosed in a volume between circuit board 602 and shield 610'. Component 604' and shield 610' can be aligned in any suitable manner relative to component 604 and shield 610. In some cases, shields 610 and 610' can be aligned relative to one another to form a box-like shape.

Board assembly 600 can include sheet of material 620 disposed over at least one of shields 610 and 610' to enhance heat dissipation. In one implementation, sheet 620 can be disposed in a U-shaped cross-section such that portion 622 of sheet 620 is disposed on a top surface of shield 610, portion 622' of sheet 620 is disposed on a top surface of shield 610', and portion 624 of sheet 600 extends between portions 622 and 622' along tabbed edges of the shields. In some cases, shields 610 and 610' can be disposed such that the edges of each of shields 610 and 610' form a substantially flat surface (e.g., a surface that extends in a single plane).

By providing a single piece of material extending between the top surfaces of shields 610 and 610', the portions of material 620 adjacent to the tabs or edges of the shields may remain secured to the shields despite the discontinuous nature of the tabs, or despite the smaller surface area of the tabs. In addition, by enclosing one or both of components 604 and 604' within a volume enclosed by material 620, material 620 may provide a barrier to water or other foreign particles that could damage components 604 and 604'.

Board Assembly 630, shown in FIG. 6B, can include component 634 mounted to circuit board 632. Shield 640 may be placed over component 634 such that the component is enclosed within a volume defined by circuit board 632 and shield 640. In some cases, circuit board 632 can include a second component 634' coupled to a surface of circuit board 632 opposite the surface to which component 634 is coupled, and can include a second shield 640' coupled to circuit board 632 such that component 634' is enclosed in a volume between circuit board 632 and shield 640'. Component 634' and shield 640' can be aligned in any suitable manner relative to component 634 and shield 640. In some cases, shields 640 and 640' can be aligned relative to one another to form a box-like shape.

Sheet of material 650 may be disposed in part over shield 640 (e.g., portion 652 of material 650) and over edge or tab portions of shield 640 and shield 640' (e.g., portion 654 of material 650). In addition, sheet of material 650 may include portion 656 extending in a plane substantially co-planar with a top surface of shield 640 and adhered to another component 636 of electronic device 600 such that sheet of material 650 forms a step. In this implementation, material 650 may form a barrier to prevent water or other contaminants from reaching components 634 and 634'.

Board assembly 660, shown in FIG. 6C, can include component 664 mounted to circuit board 662. Shield 670 may be placed over component 664 such that the component is enclosed within a volume defined by circuit board 662 and shield 670. In some cases, circuit board 662 can include a second component 664' coupled to a surface of circuit board 662 opposite the surface to which component 664 is coupled, and can include a second shield 670' coupled to circuit board 662 such that component 664' is enclosed in a volume between circuit board 662 and shield 670'. Component 664' and shield 670' can be aligned in any suitable manner relative to component 664 and shield 670. In some cases, shields 670 and 670' can be aligned relative to one another to form a box-like shape.

Sheet of material 680 may be disposed in a manner similar to that of material 620 shown in FIG. 6A. In particular, material 680 may include portions 682 and 682' disposed adjacent to top surfaces of shields 670 and 670', respectively. Material 680 may also include portions 684 and 686 adjacent to edges of shields 670 and 670' such that material 680 forms a closed loop around shields 670 and 670', thus enclosing components 664 and 664' in a closed volume.

Each of the sheets of material shown in FIGS. 6A-6C include at least one fold. Because of inherent stiffness, thickness, or other mechanical properties of the material, however, the sheet may resist bending and may peel up or adhere poorly on smaller surface areas (e.g., on tabs extending from a planar surface of a shield). Different approaches may therefore be used to provide a sheet of material to be placed on a surface of a shield in a device. In particular, different approaches may be used to create discontinuities in a sheet of material to facilitate bending. FIGS. 7A-7F are sectional views of illustrative sheets of material for use in accordance with some embodiments of the invention.

Each sheet can include several layers having different properties. In particular, each sheet can include a first adhesive layer 702 for adhering the sheet to a shield. Adhesive layer 702 can include, for example, an adhesive or glue, hook and fastener material, tape, or any other material used for adhering components together. Adhesive layer 702 can have any suitable thickness. In some cases, the thickness of layer 702 can be the smallest thickness required to ensure that the sheet will adhere to an EMI shield.

After first adhesive layer 702, each sheet can include heat-transferring layer 704. For example, each sheet can include a layer having a thickness selected to provide a particular amount of heat transfer. In some cases, the thickness of layer 704 may be selected based on mechanical properties of the material. Layer 704 can be constructed from any material suitable for transferring heat away from a component. For example, layer 704 can be constructed from graphite, a metal, a composite material, or any other material operative to enable or enhance heat transfer.

Second adhesive layer 706 can be provided on a surface of layer 704 opposite the surface to which first adhesive layer 702 is provided. Second adhesive layer 706 may be constructed from the same material as layer 702. Second adhesive layer 706 may have the same or different mechanical and structural attributes as first adhesive layer 702. For example, second adhesive layer 706 may have a same thickness as first adhesive layer 702.

An external layer 708 can be coupled to second adhesive layer 706 to provide an external surface or shell for each sheet. External layer 708 may be selected from a material having any desired mechanical attributes (e.g., resistance to abrasion, puncture, or impacts). External layer 708 can be constructed from any suitable material including, for example, Mylar®, PET, or any other plastic or composite material.

Different approaches can be used to ensure that the sheet of material will fold at an appropriate location. In some cases, the sheet of material can simply be folded without any modifications. Sheet 710, shown in FIG. 7A, may include no particular features for enabling a fold along line 712. During assembly, sheet 710 may simply be forced to fold along line 712, which may correspond to an edge in a shield over which sheet 710 is disposed.

Sheet 720, shown in FIG. 7B, may include several holes 724 provided through sheet 720 along line 722 to facilitate folding. Holes 724 may have any suitable shape or size. For example, holes 724 may include a regular or irregular pattern or distribution of holes along a line or shape corresponding to a fold region of sheet 720. Each of holes 724 can include one or more of circular or elliptical holes, polygonal holes, slots, or any other type of opening extending through sheet 720. Holes 724 may be constructed using any suitable approach including, for example, by punching or stamping holes in sheet 720 (e.g., when sheet 720 is cut).

Sheet 730, shown in FIG. 7C, may include region 736 corresponding to line 732 in which a portion of heat-transferring layer 704 is removed (e.g., an opening or a window in sheet 730) to facilitate folding. Any suitable amount of layer 704 may be removed along line 732. For example, the entirety of layer 704 may be removed along line 732. Alternatively, region 736 may include several distinct windows or openings having the same or different sizes distributed along line 732. The windows may extend through any suitable amount of line 732 including, for example, any amount in the range of 25% to 75%, or more than 75%. The windows of region 736 can be constructed using any suitable approach including, for example, laying layer 704 in manner that has windows, or removing portions of layer 704 to form region 736.

Sheet 740, shown in FIG. 7D, may include holes 744 extending through sheet 740 along line 742, combined with region 746 in which a portion of heat-transferring layer 704 is removed along line 742. Holes 744 may include some or all of the features of holes 724 described above, and region 746 may include some or all of the features of region 736 described above. In particular, holes 744 may extend through sheet 740 in both regions where layer 704 is present and through regions where layer 704 is absent (e.g., region 746).

Sheet 750, shown in FIG. 7E, may include region 754 associated with layer 704 and region 756 associated with layer 702. In each of regions 754 and 756, the associated layers may be removed starting at line 752 and extending towards portions of sheet 750 that are not placed adjacent to a top surface of a shield. For example, layers 702 and 704 may be removed in regions of sheet 750 that are placed adjacent to a tab extending from a shield lid. The thinner portions of sheet 750 (e.g., portions having only layers 706 and 708) may then easily fold at line 752.

Sheet 760, shown in FIG. 7F, may include region 764 associated with layer 704. In region 764, the associated layer may be removed starting at line 762 and extending towards portions of sheet 760 that are not placed adjacent to a top surface of a shield. For example, layer 704 may be removed in regions of sheet 750 that are placed adjacent to a tab extending from a shield lid. The thinner portions of sheet 750 (e.g., portions having only layers 702, 706, and 708) may then easily fold at line 752.

Figure 8:
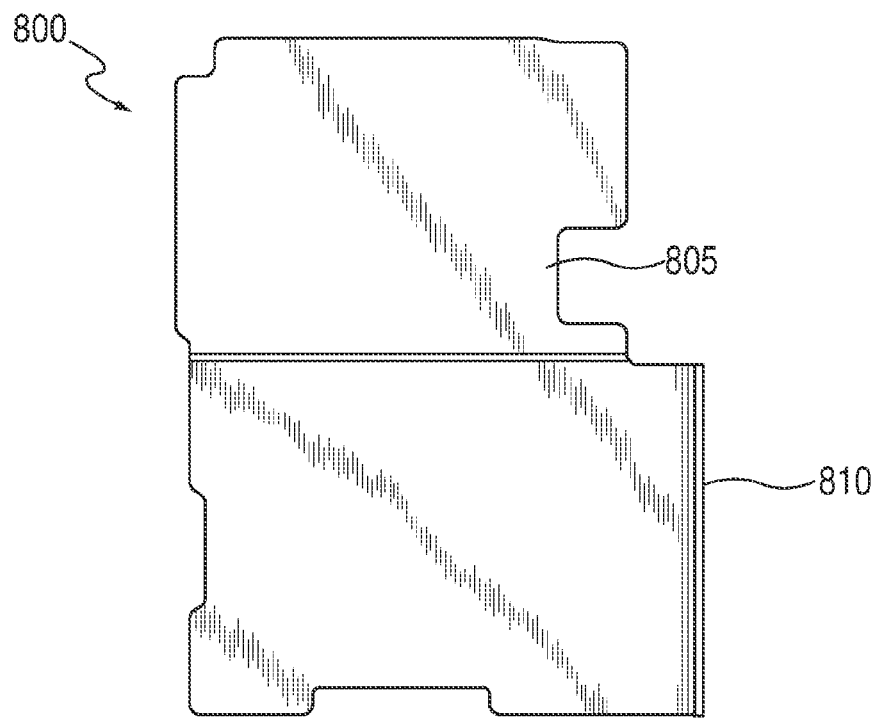
FIG. 8 is a perspective view of a sheet of material that may be adhered to a shield in accordance with some embodiments of the invention.
Figure 9:
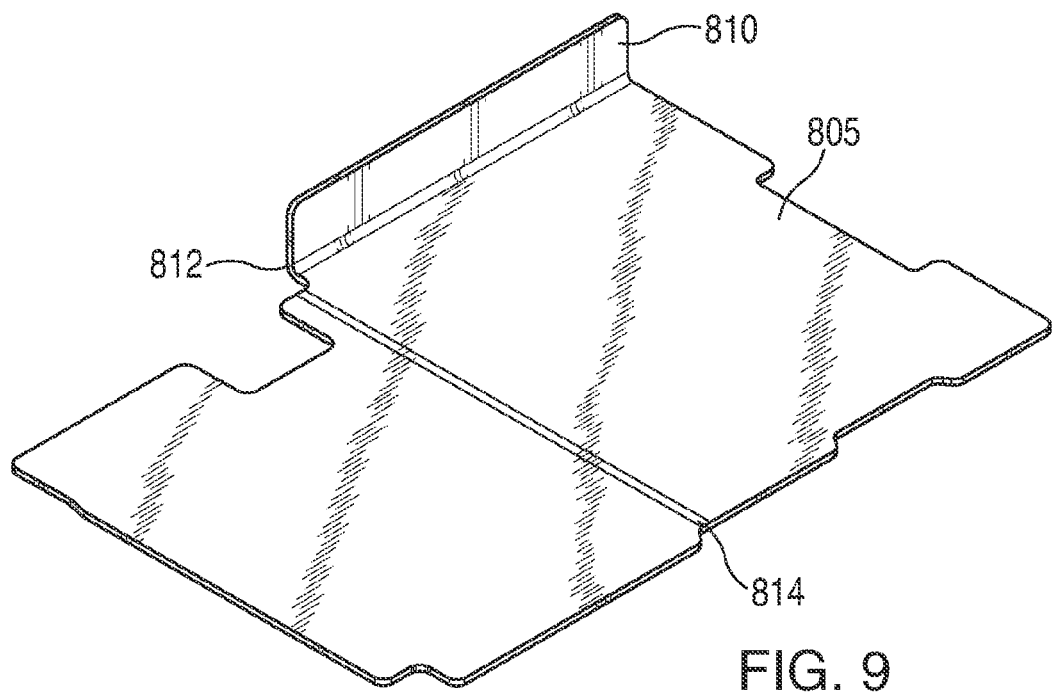
FIG. 9 is a top view of a three-dimensional disposition of the sheet of material of FIG. 8 in accordance with some embodiments of the invention.

FIG. 8 is a top view of a sheet of material that may be adhered to a shield in accordance with some embodiments of the invention. FIG. 9 is a perspective view of a three-dimensional disposition of the sheet of material of FIG. 8 in accordance with some embodiments of the invention. Sheet 800 can include a discontinuous or castellated border that corresponds to different features of the shield. For example, sheet 800 can include a border that matches the shape and dimensions of the shield. In addition, sheet 800 can include one or more tabs 810 that may fold out of primary surface 805 of sheet 800. For example, tab 810 may be in a plane perpendicular to a plane of primary surface 805 such that primary surface 805 may adhere to a top surface of a shield lid, and tab 810 may adhere to a tab or edge extending from the top surface of the shield lid. In some cases, sheet 800 can be shaped to correspond to discontinuities or variations in shape of the shield (e.g., step 814). To allow tab 810 to bend relative to primary surface 805, sheet 800 can include a sequence of perforations or other feature along edge 812 that facilitates bending.

The following flowcharts describe illustrative processes that relate to the construction and use of heat-transferring sheet on a shield. FIG. 10 is a flowchart of an illustrative process for constructing a sheet of material for transferring heat from a shield of a component in accordance with some embodiments of the invention. Process 1000 can begin at step 1002. At step 1004, several layers of material can be combined to form a sheet. For example, layers of adhesive, graphite, and an external material can be combined to form a sheet. At step 1006, a shape can be stamped into the sheet. For example, a stamp corresponding to a shape of a shield or of a shield lid can be used to cut away a portion of the sheet. In some cases, a stamp having several shapes can be used to cut away several shapes from a single sheet. At step 1008, holes or other discontinuities can be provided in the sheet along at least one edge at which the sheet is folded. For example, a sequence of holes can be provided along a line in the sheet around which the sheet will be folded (e.g., where the sheet will fold to adhere to a top surface and to a tab of a shield lid). The holes can be provided using any suitable approach including, for example, stamping, drilling, laser cutting or any other such approach. Process 1000 can then end at step 1010.

FIG. 11 is a flowchart of an illustrative process for adhering a sheet to a shield in accordance with some embodiments of the invention. Process 1100 can begin at step 1102. At step 1104, a sheet of material having a sequence of holes can be provided. For example, a sheet constructed using process 1000 (FIG. 10) can be provided. At step 1106, the sheet may be positioned over a shield such that the holes in the sheet are aligned with an edge of a shield. For example, the sheet may be positioned such that holes that facilitate the bending of the sheet are aligned with an edge of a shield lid from which tabs extend. At step 1108, the sheet may be adhered to the shield. For example, an adhesive layer of the sheet may be secured to the shield lid. Process 1100 can then end at step 1110.

The above described embodiments of the present invention are presented for purposes of illustration and not of limitation, and the present invention is limited only by the claims which follow.

What is claimed is:

1. A board assembly, comprising:
   a fence coupled to a circuit board, the fence forming a perimeter extending from the circuit board;
   a lid comprising a planar surface and at least one tab extending from the planar surface at an edge, wherein the lid is placed over the fence such that the at least one tab engages the fence; and
   a sheet of heat-transferring material disposed over the planar surface and the at least one tab, wherein the sheet has a plurality of holes extending through the sheet and aligned with the edge.

2. The board assembly of claim 1, wherein:
   the fence defines a closed loop.

3. The board assembly of claim 2, wherein:
   at least one component is coupled to the circuit board within the region enclosed by the fence.

4. The board assembly of claim 1, wherein the sheet further comprises:
   a graphite layer; and
   an adhesive layer, wherein the adhesive layer is positioned between the graphite layer and the lid.

5. The board assembly of claim 4, wherein the sheet further comprises:

a plastic layer; and a second adhesive layer, wherein the second adhesive layer is positioned between the graphite layer and the plastic layer.

6. The board assembly of claim 1, wherein the plurality of holes further comprise:

a sequence of holes evenly distributed along the edge.

7. The board assembly of claim 1, wherein the plurality of holes further comprise:

a plurality of circular holes.

8. The board assembly of claim 1, wherein the plurality of holes further comprise:

a plurality of slots.

9. Apparatus, comprising:

a circuit board;

a component on the circuit board;

an electromagnetic interference shielding structure that covers the component; and a heat-transferring sheet having at least one discontinuity that facilitates bending along the discontinuity to align with an edge of the electromagnetic interference shielding structure, wherein the heat-transferring sheet comprises:

a first adhesive layer that is coupled to the electromagnetic interference shielding structure;

a layer of graphite on the first adhesive layer;

a second adhesive layer on the layer of graphite; and an external layer over the second adhesive layer.

10. The apparatus defined in claim 9 wherein the external layer comprises a plastic layer.

11. The apparatus defined in claim 9 wherein the at least one discontinuity of the heat-transferring sheet is formed from a plurality of holes extending through each of the first adhesive layer, the graphite layer, the second adhesive layer, and the external layer.

12. The apparatus defined in claim 9 wherein the at least one discontinuity of the heat-transferring sheet is formed from an opening in only the graphite layer.

13. The apparatus defined in claim 9 wherein the electromagnetic interference shielding structure comprises:

a fence; and a lid having a planar surface that covers the fence, wherein the lid includes tab portions that extend perpendicularly from the planar surface and are secured to the fence.

14. The apparatus defined in claim 9 wherein the second adhesive layer and the external layer cover the planar surface and the tab portions of the lid and wherein the first adhesive layer and the layer of graphite cover only the planar surface of the lid.

15. The apparatus defined in claim 9 further comprising:

an additional component that is adjacent to the component, wherein at least part of the heat-transferring sheet is interposed between the tab portions of the lid and the additional component and prevents the tabs portions from damaging the additional component.

16. The apparatus defined in claim 9 wherein the circuit board has first and second opposing surfaces, wherein the component comprises a first component mounted on the first surface of the circuit board, the apparatus further comprising:

a second component mounted on the second surface of the circuit board, wherein the heat-transferring sheet comprises a U-shaped sheet that covers the first component on the first surface of the circuit board and the second component on the second surface of the circuit board.

17. The apparatus defined in claim 9 wherein the heat-transferring sheet encloses the component.

18. Apparatus, comprising:

a circuit board;

a component on the circuit board;

a fence on the circuit board around the component; a lid having a planar portion and at least one tab portion that extends from the planar portion at an edge and is coupled to the fence; and a graphite layer that covers the planar portion at the at least one tab portion of the lid, wherein openings in the graphite sheet facilitate bending at the edge between the planar portion and the tab portion of the lid.

19. The apparatus defined in claim 18 wherein the graphite layer forms part of a heat-transferring sheet that comprises: a first adhesive layer that is coupled to the lid, wherein the graphite layer is on the first adhesive layer; a second adhesive layer on the graphite layer; and an external layer of the heat-transferring sheet that is on the second adhesive layer.

20. The apparatus defined in claim 19 wherein the fence and the lid shield the component from electromagnetic interference.

* * * * *